US005480679A

United States Patent [19]

Schmidt et al.

[11] Patent Number: 5,480,679

[45] Date of Patent: Jan. 2, 1996

[54] PREVENTION OF ENZYME MEDIATED DISCOLORATION OF WOOD

[75] Inventors: Elmer L. Schmidt, Shoreview, Minn.; Terry L. Amburgey, Starkville, Miss.

[73] Assignee: Regents of the University of Minnesota, Minneapolis, Minn.

[21] Appl. No.: 56,685

[22] Filed: Apr. 30, 1993

[51] Int. Cl.[6] .............................. C23C 16/00; B32B 9/04

[52] U.S. Cl. .............................. 427/254; 83/14; 144/335; 428/541; 428/543; 428/907

[58] Field of Search .............................. 428/541, 540, 428/537.1, 907, 543; 427/325, 440, 254; 106/12; 83/14, 22; 144/335

[56] References Cited

U.S. PATENT DOCUMENTS

| | | | |
|---|---|---|---|
| 3,464,782 | 9/1969 | Ricard et al. | 427/254 |
| 5,196,407 | 3/1993 | Goletz et al. | 514/63 |

OTHER PUBLICATIONS

R. A. Zabel and J. J. Morrell, "Wood Stains and Discolorations," *Wood Microbiology: Decay and Its Prevention*, pp. 326–343 (1992).

L. H. Williams, et al. "Treatment of Freshly Sawn Hardwood Lumber," *Proceedings: XIX Annual Hardwood Symposium of the Hardwood Council*, Starkville, Ms (Mar. 1991) pp. 105–117.

J. W. Clark, "A Gray Non–Fungus Seasoning Discoloration of Certain Red Oaks," *Southern Lumberman* 194:35–38 (1957).

G. M. Barton and J. A. F. Gardner, "Brown–Stain Formation and the Phenolic Extractives of Western Hemlock," Publication No. 1147, Department of Forestry, Ottawa, Canada (1966).

D. J. Miller et al., "Chemical Brown Staining of Douglas–Fir Sapwood," *Forest Products Journal* 33(4):44–48 (1983).

J. W. Bailey, "Oxidizing Enzymes and their Relation to Sap Stain in Lumber," *Botanical Gazette* 50:142–147 (1910).

M. Y. Cech, "New Treatment to Prevent Brown Stain in White Pine," *Forest Prod. J.* 16(11):23–27 (1966).

M. A. Hulme and J. F. Thomas, "Stain Control in Eastern White Pine Using Ammoniacal Zinc Oxide in Mill Conditions," *Forest Prod. J.* 25(6):36–39 (1975).

M. A. Hulme and J. F. Thomas, "Control of Brown Stain in Eastern White Pine with Reducing Agents," *Forest Prod. J.* 33(9):17–20 (1983).

E. W. Price, "Chemical Stains in Hackberry Can Be Prevented," *Southern Lumberman* 243(2019):13–15 (1982).

P. G. Forsyth, "Control of Nonmicrobial Sapstains in Southern Red Oak, Hackberry, and Ash Lumber During Air–Seasoning" M. S. Thesis, Mississippi State University, Mississippi (1988).

T. L. Amburgey and P. G. Forsyth, "Prevention and Control of Gray Stain in Southern Red Oak Sapwood" *Proceedings, Hardwood Research Council* pp. 92–99 (1987).

P. G. Forsyth and T. L. Amburgey, "Prevention of Non–Microbial Sap Stains in Water–Stored Oak Logs," *Forest Prod. J.* 42(4):59–61 (1992).

W. L. MacDonald, E. L. Schmidt and E. J. Hamer, "Methyl Bromide Eradication of the Oak Wilt Fungus from Red and White Oak Logs", *Forest Prod. J.* 35(7):11–16 (1985).

M. Ruetze and W. Liese, "A Postfumigation Test (TTC) for Oak Logs," *Holzforschung* 39:327–330 (1985).

E. L. Schmidt, "Control of Mold and Stain on Methyl Bromide Fumigated Red Oak Sapwood," *Forest Prod. J.* 35(2):61–62 (1985).

E. L. Schmidt, "An Overview of the Methyl Bromide Fumigation of Oak Logs Intended for Export to the EEC," Paper No. 16, 390 of the contribution series of the Minnesota Agricultural Experiment Station (1988).

*Primary Examiner*—Paul J. Thibodeau
*Assistant Examiner*—Stephen Sand
*Attorney, Agent, or Firm*—Schwegman, Lundberg & Woessner

[57] ABSTRACT

Methods for preventing non-fungal discoloration of logs, wood and wood products that are free of non-fungal discolorations are provided. The wood is treated with a phytotoxic agent in order to prevent enzyme-mediated discoloration of the wood. The wood subsequently may be monitored to determine viability of parenchyma cells. This invention also relates to unmilled wood that is substantially free of non-fungal discolorations and has nonviable parenchyma cells.

11 Claims, No Drawings

PREVENTION OF ENZYME MEDIATED DISCOLORATION OF WOOD

This invention was made with government support under 93-34158-8349 awarded by the U.S. Department of Agriculture. The government has certain rights in the invention.

FIELD OF THE INVENTION

This invention relates generally to the field of methods for preventing enzyme-mediated discoloration of wood and to wood products that are free of enzyme-mediated discolorations. In particular this invention relates to a method of preventing enzyme-mediated discoloration of lumber by treating logs with a phytotoxic agent. This invention also relates to wood treated so that it is free of enzyme-mediated discolorations.

BACKGROUND OF THE INVENTION

Wood is commonly used in construction and furniture, and many users pay a premium for clear, defect-free wood. A number of chemical agents and natural processes can discolor and deteriorate wood, reducing its aesthetic and structural value. Discolorations or "sapstains" are abnormal color patterns that develop in wood and adversely affect its value. Most discolorations are readily delineated from normal color patterns. Discolorations that develop in the sapwood of various species of wood during lumber manufacture and drying have been a continuing cause of financial loss to the forest products industry. Losses due to discolorations have become greater in recent years because of an emphasis on natural finishes and the growth of an export market for clear, light wood timbers. R. A. Zabel and J. J. Morrell, "Wood Stains and Discolorations," *Wood Microbiology: Decay and Its Prevention*, pp. 326–43 (1992) (hereinafter "*Wood Microbiology*").

Compounds and treatments have been developed for preserving wood and wood materials having good activity against wood-discoloring fungi and wood-destroying insects. See, e.g., U.S. Pat. No. 5,196,407. Treatments have also been developed to control wood discoloration caused by microorganisms. Treatments used to control discolorations caused by microorganisms in wood, however, are ineffective in preventing discoloration caused by wood enzymes. L. H. Williams, et al., "Treatment of Freshly Sawn Hardwood Lumber," *Proceedings: XIX Annual Hardwood Symposium of the Hardwood Council*, Starkville, Miss. (March 1991) pp. 105–117; J. W. Clark, "A Gray Non-fungus Seasoning Discoloration of Certain Red Oaks," *Southern Lumberman* 194:35–38 (1957).

Dark discolorations caused by enzymatic reactions have been seen in softwoods such as ponderosa pine, white pines (eastern, western and sugar) and western hemlock after kiln drying during the lumber manufacturing process. E. E. Hubert, *Outline Of Forest Pathology* (John Wiley, New York, 1931). G. M. Barton and J. A. F. Gardner, "Brown-Stain Formation and the Phenoiic Extractives of Western Hemlock," Publication No. 1147, Department of Forestry, Ottawa, Canada (1966). The stain develops both in the sapwood and in the heartwood. The enzymes oxidize phenols to leuco intermediates. These compounds subsequently react with oxygen and are carried toward the wood surface during kiln drying to form a brown stain. M. A. Hulme and J. F. Thomas, "Control of Brown Stain in Eastern White Pine with Reducing Agents." *Forest Prod. J.* 33:17–20 (1983).

A similar stain has been noted on Douglas fir. This stain develops rapidly under moist, warm conditions. D. J. Miller et al., "Chemical Brown Staining of Douglas Fir Sapwood," *Forest Products Journal* 33(4):44–48 (1983). Water-soluble extractives appear to migrate to the wood surface, where they undergo oxidation to produce a brown, polymerized pigment. The stain usually is close to the surface of the wood, but also has been observed deeper in bulk-piled wood.

Hardwoods can develop deep yellow to reddish brown discolorations on the surface of the wood when exposed to air immediately after sawing or peeling. These discolorations are especially noticeable on cherry, birch, red alder, sycamore, oak, maple, and sweet gum. This stain develops in red alder, oaks, birch, and maple during air-seasoning. *Wood Microbiology* pp. 326–43. Such stain is absent in wood that is immediately kiln dried and appears less frequently under cool conditions. The staining is most likely caused by an enzymatic reaction. I. W. Bailey, "Oxidizing Enzymes and Their Relation to "Sap Stain" in Lumber," *Botanical Gazette* 50:142–147 (1910).

A related gray stain on several varieties of southern oaks also appears to be oxidative in nature. J. W. Clark, "A Gray Non-fungus Seasoning Discoloration of Certain Red Oaks," *Southern Lumberman* 193(2417):35–58 (1956). Gray stain is more difficult to control in lumber cut from water-stored logs than from freshly cut logs. This problem may be caused by the decreased senescence of parenchyma cells in water-stored logs compared to dry-stored logs. P. G. Forsyth and T. L. Amburgey, "Prevention of Non-microbial Sapstains in Water-stored Oak Logs," *Forest Prod, J.* 42(4):59–61 (1992).

Methods for controlling enzyme-mediated discoloration of wood have centered on the use of heat, such as steam, hot water, or microwave energy. The stain in alder and several birches can be controlled by immersion in boiling water for several minutes. I. W. Bailey, "Oxidizing Enzymes and Their Relation to "Sap Stain" in Lumber," *Botanical Gazette* 50:142–147 (1910). This method of stain prevention is slow and costly and therefore is rarely used.

Additional methods of preventing enzyme-mediated staining include kiln-drying of unseasoned lumber as soon as it is cut or use of long, mild kiln schedules. These remedies, however, are impractical and therefore rarely used. Another method involves dipping of individual pieces of milled lumber into solutions of various reducing agents or anti-oxidants in order to control enzyme-mediated discoloration. T. L. Amburgey and P. G. Forsyth, "Prevention and Control of Gray Stain in Red Oak Lumber," *Proceedings, Hardwood Research Council* pp. 92–99 (1987); M. Y. Cech, "New Treatment to Prevent Brown Stain in White Pine," *Forest Prod. J.* 16(11):23–27 (1966); P. G. Forsyth and T. L. Amburgey, "Prevention of Non-microbial Sapstains in Water-stored Oak Logs," *Forest Prod. J.* 42(4):59–61 (1992). Freshly sawn lumber is dipped in sodium azide or sodium fluoride to prevent brown stains in some types of wood.

This dipping in sodium azide or sodium fluoride is not favored, though, because these compounds are hazardous. The use of these chemicals is undesirable given their environmental and in-plant pollution potential and residual presence on wood provided to the consumer. Further, these chemicals are not completely effective against gray stain, another enzyme-medicated discoloration of hardwoods.

A one-dip treatment using ammoniacal zinc oxide was found to be as effective as dipping treatments of sodium fluoride when eastern white pine was treated at a lumber mill to arrest stain appearing during kiln-drying or air-seasoning. This solution could effectively control brown chemical staining (kiln-burn) occurring during kiln-drying. M. A. Hulme and J. F. Thomas, "Stain Control in Eastern White Pine Using Ammonical Zinc Oxide in Mill Conditions," *Forest Prod. J.* 25(6):36–39 (1975); M. A. Hulme and J. F. Thomas, "Control of Brown Stain in Eastern White Pine with Reducing Agents," *Forest Prod. J.* 33(9):36–39 (1983); E. W. Price, "Chemical Stains in Hackberry Can Be Prevented," *Southern Lumberman* 243(2019):13–15 (1982). It has been shown that dipping freshly sawn boards in water solutions of 5% sodium sulphite or sodium thiosulfate is an effective and safe control of brown stain in eastern white pine. M. A. Hulme and J. F. Thomas, "Control of Brown Stain in Eastern White Pine with Reducing Agents," *Forest Products Research Society* 33(9):17–20 (1983). These processes of dipping individual pieces of sawn lumber, however, are quite time-consuming and therefore impractical for large-scale lumber manufacturing.

Other chemical treatments, such as treatment with sodium bisulfite, are under development but require two weeks of wood storage for sufficient chemical diffusion into lumber pieces. P. G. Forsyth, "Control of Nonmicrobial Sapstains in Southern Red Oak, Hackberry, and Ash Lumber During Air-Seasoning" M.S. thesis, Mississippi State University, Mississippi (1988). Further, the sodium bisulfite treatments are not effective if logs have been stored under wet conditions for more than three weeks, as is commonly done to prevent fungal attack of logs prior to processing into lumber. Iron corrosion is also a problem with this treatment. T. L. Amburgey and P. G. Forsyth, =37 Prevention and Control of Gray Stain in Red Oak Lumber," *Proceedings, Hardwood Research Council* pp. 92–99 (1987); P. G. Forsyth and T. L. Amburgey, "Prevention of Non-microbial Sapstains in Water-stored Oak Logs," *Forest Prod. J.* 42(4):59–61 (1992).

SUMMARY OF THE INVENTION

The present invention is a novel and useful method identified as preventing enzyme-mediated discoloration of wood and wood materials. This invention also claims wood or wood materials that have been treated so as to be free of enzyme-mediated discoloration. The invention is practiced by first placing freshly harvested wood or wood materials in an enclosure. Next, the wood is treated with an effective amount of a phytotoxic fumigant under conditions sufficient to kill substantially all parenchymal cells while preserving the structural integrity of the wood or wood materials. After treating the wood, the wood may be monitored for the viability of the parenchymal cells. The wood is also monitored for the absence of enzyme-mediated staining.

A variety of phytotoxic fumigant agents may be used to treat the wood. For example, methyl bromide (e.g. Brom-O-Gas®); sulfuryl fluoride (e.g. Vikane®); metan-sodium (e.g. Busan 1020®); an ammonia-containing fumigant such as ammonia gas; or a liquid or solid generating a wood-penetrating fumigant may be used. The treatment method may be by fumigating or spraying the phytotoxic agent or by applying a liquid or solid phytotoxic agent that turns into a wood-penetrating gas.

The present invention also includes unmilled wood (e.g., logs or otherwise unsawn, harvested timber) substantially free of viable parenchymal cells while retaining structural integrity, and designated as free of, or treated to be free of, enzyme-mediated discoloration. The starting materials may be softwoods or hardwoods such as red oak or sugar hackberry. The wood may be destined for export or for use within the United States.

DETAILED DESCRIPTION

Enzyme-mediated processes involving by-products from senescing parenchyma cells or inside viable parenchyma and other living cells in sap-wood appear to be involved in the development of certain types of discoloration in wood. Therefore, the inactivation of these enzymes present in fresh wood and/or the rapid destruction of parenchyma and other living cells would prevent the enzyme-mediated discoloration of wood. Methyl bromide has been shown to deeply penetrate sapwood of oak logs in fumigations designed to eradicate the oak wilt fungus. W. L. MacDonald, E. L. Schmidt, and E. J. Harner, "Methyl Bromide Eradication of the Oak Wilt Fungus from Red and White Oak Logs," *Forest Prod. J.* 35(7): 11–16. (1985). In addition, coincidentally such a fumigation is effective in causing death of parenchyma cells in logs fumigated with high doses of methyl bromide. M. Ruetze and W. Liese, "A Postfumigation Test (TTC) for Oak Logs," *Holzforschung* 39:327–330 (1985). Methyl bromide is effective as a general biocide by combining with the sulfhydryl groups of proteins and enzymes. FAO, Data sheets on pesticides: No. 5-Methyl bromide. VBC/DS/75.5, 10 pages (1975).

The use of fumigants such as methyl bromide to penetrate the sapwood zone of logs with bark intact and to inactivate enzymes and/or eliminate the source of such enzymes, the parenchyma and other living cells, is a novel approach to the control of enzyme-mediated stain in such wood. The fumigation of logs of red oak and hackberry prevented subsequent stain development in lumber whereas untreated log sections from the same trees developed significant stain in processed lumber. This approach of treating the entire log with a gaseous fumigant capable of deep penetration throughout the living cell zone in the sapwood offers improvement on existing systems in both ease and cost of application and can be done with minimal equipment requirements.

Another advantage of this approach is that the treatment may be applied to entire logs rather than to individual pieces of wood at later processing stages. A further advantage is that because the gas exits the wood upon aeration, no residual chemical problem exists. The treatment does not affect the performance of biocides used on lumber to prevent fungal stain. E. L. Schmidt, "Control of Mold and Stain on Methyl Bromide Fumigated Red Oak Sapwood," *Forest Prod. J.* 35(2): 61–62 (1985).

This invention comprises treating recently harvested wood with phytotoxic agents under conditions sufficient to kill substantially all parenchymal cells in the wood and subsequently monitoring for the presence or absence of staining in the wood. As used herein, "recently harvested" wood is discoloration-prone wood sufficiently recently harvested that enzyme-mediated discoloration has not yet occurred, assuming the wood is not otherwise treated to prevent such discoloration. Generally, this is wood felled within the previous week, although the time can vary with wood species and climate conditions without departing from the spirit of the present invention.

The method of the present invention involves the selection of a phytotoxic agent and a means for delivering the agent to the subject wood. The phytotoxic agent is preferably a fumigant capable of log penetration. More preferably the phytotoxic agent is methyl bromide, sulfuryl fluoride, ammonia gas or an ammonia-containing fumigant. Most preferably the phytotoxic agent is methyl bromide.

The treatment means can be by fumigation or spraying the agent on the wood. Preferably, the wood is fumigated with the phytotoxic agent. The wood is treated with an effective amount of a phytotoxic agent under conditions sufficient to kill substantially all parenchyma cells while preserving the structural integrity of the wood or wood materials. The term "structural integrity" is defined herein as intercellular contact and composition contributing to the physical support of woody structures. Wood retaining its structural integrity can fulfill generally accepted commercial criteria for construction lumber, furniture lumber and similar commercial lumber classifications. Examples, without limitation, of wood that has lost its structural integrity are rotten wood or burned wood. After treatment with the phytotoxic agent, the wood is monitored for the viability of the parenchymal cells and for the absence of non-fungal staining.

The present inventors have discovered that lumber made from logs treated as described above is reliably free of enzyme-mediated stain. As such, the wood or wood materials may be designated as free of enzyme-mediated discoloration (staining), or treated to be free of such discoloration. This designation can take the form of a label affixed to the wood or wood materials, or a similar indication placed on a bill of sale, stripping label or any other such designation accompanying the commercial transfer of the treated wood or wood materials. Such designation need not specifically recite the term 37 enzyme-mediated" to identify this form of staining. Any term recognized by those having ordinary skill in the art may be used, as long as the designation is directed to the form of discoloration mediated by enzymes (e.g., non-fungal, enzyme stain, brown stain, gray stain, or equivalent term).

The invention will be further understood with reference to the following illustrative embodiments, which are purely exemplary, and should not be taken as limiting the true scope of the present invention as described in the claims.

EXAMPLE 1

Treatment of Wood with Phytotoxic Agent

In mid-June, two red oak (Quercus spp.) and three sugar hackberry (*Celtis laevigata*) trees were cut into bolts (1.5 m long) in north-central Mississippi. Logs were segregated into four experimental piles of six logs each (two oak bolts from each tree and two hackberry bolts from different trees). The treatments were started within 30 hours of felling. The experimental piles were treated as follows:

(1) no treatment (control);

(2) stack covered with six mil black polyethylene with one oak log fitted with a thermocouple buried eight cm into the sapwood near the heartwood boundary for temperature monitoring. This stack was made to assure that the temperature effects on subsequent stain development could be separated from those resulting from fumigation;

(3) stack covered with six mil black polyethylene and fumigated with methyl bromide (Brom-O-Gas with chloropicrin warning agent [2%]; Great Lakes Chemical Co.; W. Lafayette, Ind.); and (4) same as stack (3) above. The fumigation treatment was duplicated, i.e. stacks (3) and (4) were treated in an identical fashion, to protect against loss of data due to tarp rupture or excessive leakage that might reduce the rate of log cell death.

Each methyl bromide-treated stack was covered with a small wood frame to allow space for gas circulation and fitted with a small electric fan prior to tarping. Sand was placed around the tarps to reduce small leaks at the tarp base. Sealed stacks were gassed with methyl bromide at an initial rate of 260 grams methyl bromide per cubic meter of space under tarp, which was considered adequate to effectively kill the parenchyma cells. The stacks were immediately checked for leakage with a flame-type halide detector. At 24 and 48 hours after the initial methyl bromide application, additional gassing (½ the original amount added) was done to assure high concentrations within the tarp and replace gas sorbed into logs or lost through small leaks. All tarps were removed after eight days.

EXAMPLE 2

Monitoring Treated Wood for Cell Viability

Viability of parenchyma cells was tested in the following manner for all logs prior to treatment. Cores of two centimeters in size were taken beneath the bark and were soaked in a 1% aqueous solution of 2, 3, 5-triphenyl-2H-tetrazolium chloride (TTC) for 24–36 hours. This test commonly has been used to detect dehydrogenase activity associated with living cells. Living cells reduce colorless TTC to a red formazan.

After tarp removal, partial disks were cut from the centers of logs of each species and three small splits were taken by chisel to provide a radial face from bark to heartwood (where detectable) for visualization of living cells after TTC soaking. Select chips were further examined microscopically to assure that all red color was associated with parenchyma cell structure and not microorganisms which could also effect the TTC reduction to formazan.

Logs were then cut into nominal 2.6 cm thick lumber. Lumber was dipped for one minute in a commercially-available biocide to prevent fungal stain. The bulk-stacked vertical piles as discussed in Example I were covered with a 6 mil polyethylene tarp for 6 weeks. Lumber pieces were individually examined for sapwood discolorations on removal from the stacks and then stickered for air drying. The stickering process consists of stacking lumber with small sticks placed between pieces of lumber allowing air to access the stacked lumber. After air drying, the lumber was again examined for discolorations in sapwood.

As expected, all logs showed living parenchyma cells by the TTC test prior to treatments. The chips taken at the end of the trial clearly showed the presence of living parenchyma in both the control and covered-only piles by the TTC assay whereas there was no color development in any of the chips from the logs in the fumigated piles. The increase in temperature of logs under tarp did not affect the cell viability whereas the gas treatment did kill the parenchyma cells.

EXAMPLE 3

Monitoring Wood for Presence of Non-fungal Stain

The piles as delineated in Example 1 were examined after eight days of treatment for visual external changes. The control pile was unchanged except for an initial grey-blue stain forming on the ends of the hackberry logs. The tarp-only pile also showed noticeable stain on the ends of hackberry logs as well as some slight mold growth on the ends of the oak logs. The maximum temperature recorded within the oak sapwood during covering was 42° C. The fumigated logs (both stacks) had no visible mold or other discolorations, and the hackberry logs were free of obvious stain. After six weeks of bulk-stacking under restricted drying conditions, lumber from the tarped-only and control logs of both species developed very heavy stain in the sapwood zone. No stain was noted in lumber cut from fumigated logs. Likewise, no stain developed subsequent to the air drying of the lumber. This lumber was therefore classifiable as substantially clear and unstained.

The rapid death of parenchyma is interpreted as preventing the generation and/or release of discoloration-mediating enzymes or other by-products that may contribute to the staining process occuring throughout the slow and natural senescence of ray cells during log storage. This treatment also should be effective if applied prior to water storage of logs. The fumigation does not reduce fungicide efficacy on red oak or hackberry.

The foregoing detailed description has been provided for a better understanding of the invention only and no unnecessary limitation should be understood therefrom as some modifications will be apparent to those skilled in the art without deviating from the spirit and scope of the appended claims.

We claim:

1. A method for treating unmilled logs in order to obtain wood products which have not been discolored by enzyme mediated discoloration, comprising the steps of:

selecting unmilled logs which have not been discolored by enzyme mediated discoloration and placing the selected logs in an enclosure prior to the formation of enzyme mediated discoloration; and applying an effective mount of a gas or liquid phytotoxic fumigant composition under atmospheric pressure and at ambient temperature to the unmilled logs so as to kill substantially all parenchyma cells and thereby prevent enzyme mediated discoloration in the finished wood products, while maintaining the structural integrity of the logs.

2. The method of claim 1 wherein said phytotoxic fumigant is selected from the group consisting of a wood-penetrating fumigant, a liquid capable of generating a wood-penetrating fumigant or a solid capable of generating a wood-penetrating fumigant.

3. The method of claim 2 wherein said phytotoxic fumigant is methyl bromide.

4. The method of claim 2 wherein said phytotoxic fumigant is sulfuryl fluoride.

5. The method of claim 2 wherein said phytotoxic fumigant is ammonia gas.

6. The method of claim 2 wherein said phytotoxic fumigant is metam-sodium.

7. The method of claim 1, wherein said unmilled logs have intact bark.

8. A method for treating unmilled logs in order to obtain wood products which have not been discolored by enzyme mediated discoloration, comprising the steps of:

selecting, unmilled logs which have not been discolored by enzyme mediated discoloration and placing the selected logs in an enclosure prior to the formation of enzyme mediated discoloration;

applying an effective amount of a gas or liquid phytotoxic fumigant composition under atmospheric pressure and at ambient temperature to the unmilled logs so as to kill substantially all parenchyma cells and thereby prevent enzyme mediated discoloration in the finished wood products, while maintaining the structural integrity of the logs; and manufacturing lumber from said logs.

9. The method of claim 1 or 8, further comprising the step of water storing said logs, said storing step occurring after said logs have been treated to prevent enzyme mediated discoloration.

10. The method of claim 1 or 8, wherein said logs comprise logs harvested from hardwood trees.

11. The method of claim 10, wherein said logs are selected from the group consisting of white oak, red oak, sugar hackberry, ash, maple, hickory, red alder, cherry, birch, sycamore and sweet gum.

* * * * *

UNITED STATES PATENT AND TRADEMARK OFFICE

CERTIFICATE OF CORRECTION

PATENT NO. : 5,480,679

DATED : January 2, 1996

INVENTOR(S) : Elmer L. Schmidt et al.

It is certified that error appears in the above-indentified patent and that said Letters Patent is hereby corrected as shown below:

Column 3 Line 54 "metan" should read --metam-- therefor.

Column 7 Line 34 "mount" should read --amount-- therefor.

Column 8 Line 19 --delet "," after "selecting"-- therefor.

Signed and Sealed this

Twenty-seventh Day of August, 1996

Attest:

BRUCE LEHMAN

*Attesting Officer*

*Commissioner of Patents and Trademarks*